United States Patent
Smialek et al.

[11] Patent Number: 5,275,670
[45] Date of Patent: Jan. 4, 1994

[54] HIGH TEMPERATURE, OXIDATION RESISTANT NOBLE METAL-AL ALLOY THERMOCOUPLE

[75] Inventors: James L. Smialek, Strongsville; Michael G. Gedwill, N. Olmsted, both of Ohio

[73] Assignee: The United States of America as represented by the Administrator of the National Aeronautics and Space Administration, Washington, D.C.

[21] Appl. No.: 86,584

[22] Filed: Jul. 6, 1993

[51] Int. Cl.$^5$ .......................................... H01L 35/12
[52] U.S. Cl. ............................... 136/236.1; 136/241
[58] Field of Search ....................... 136/236.1, 241; 374/179

[56] References Cited

U.S. PATENT DOCUMENTS

| | | | |
|---|---|---|---|
| 1,789,733 | 1/1931 | Feuszner | 136/241 |
| 2,335,707 | 11/1943 | Streicher | 136/5 |
| 2,406,172 | 8/1946 | Smithells | 75/22 |
| 2,846,493 | 8/1958 | Lindenblad | 136/5 |
| 2,846,494 | 8/1958 | Lindenblad | 136/5 |
| 3,066,177 | 11/1962 | Schneider et al. | 136/5 |
| 3,372,062 | 6/1968 | Zysk | 136/227 |
| 3,901,734 | 8/1975 | Sibley et al. | 136/241 |
| 4,110,124 | 8/1978 | Robertson et al. | 136/236 R |
| 4,402,447 | 9/1983 | Przybyszewski et al. | 228/103 |
| 4,415,758 | 11/1983 | Lacoste et al. | 136/233 |
| 4,984,904 | 1/1991 | Nakano et al. | 374/139 |
| 5,043,023 | 8/1991 | Bentley | 136/232 |

OTHER PUBLICATIONS

Sze, S.M., ed., *VLSI Technology*, pp. 347-361, 1983.
Fink, Donald G. and Donald Christiansen, eds., *Electronics Engineers Handbook*, 1989, pp. 10-30-10-32.
Vassos, Basil H. and Galen W. Ewing, *Analog and Digital Electronics for Scientists*, 1972, pp. 252-254.
Diefenderfer, A. James, *Principles of Electronic Instrumentation*, 1972, pp. 82-84.
*Metallurgical Transactions A*, vol. 8A, pp. 1697-1707 (Nov. 1977), MR. Jackson et al, "The Aluminization of Platinum and Platinum Coated IN-738".
"Platinum Modified Aluminides—Present Status", presented at the Gas Turbine and Aeroengine Congress and Expedition—Brussels, Belgium, J. S. Smith et al, Jun. 11-14, 1990, pp. 1-10.

*Primary Examiner*—Donald P. Walsh
*Assistant Examiner*—Chrisman Carroll
*Attorney, Agent, or Firm*—Gene E. Shook; Guy M. Miller; James A. Mackin

[57] ABSTRACT

A thermocouple having an electropositive leg formed of a noble metal-Al alloy and an electronegative leg electrically joined at respective ends thereof to form a thermocouple junction. The thermocouple provides for accurate and reproducible measurement of high temperatures (600°-1300° C.) in inert, oxidizing, or reducing environments, gases or vacuum. Furthermore, the thermocouple circumvents the need for expensive, strategic precious metals such as rhodium as a constituent component. Selective oxidation of rhodium is also thereby precluded.

20 Claims, 2 Drawing Sheets

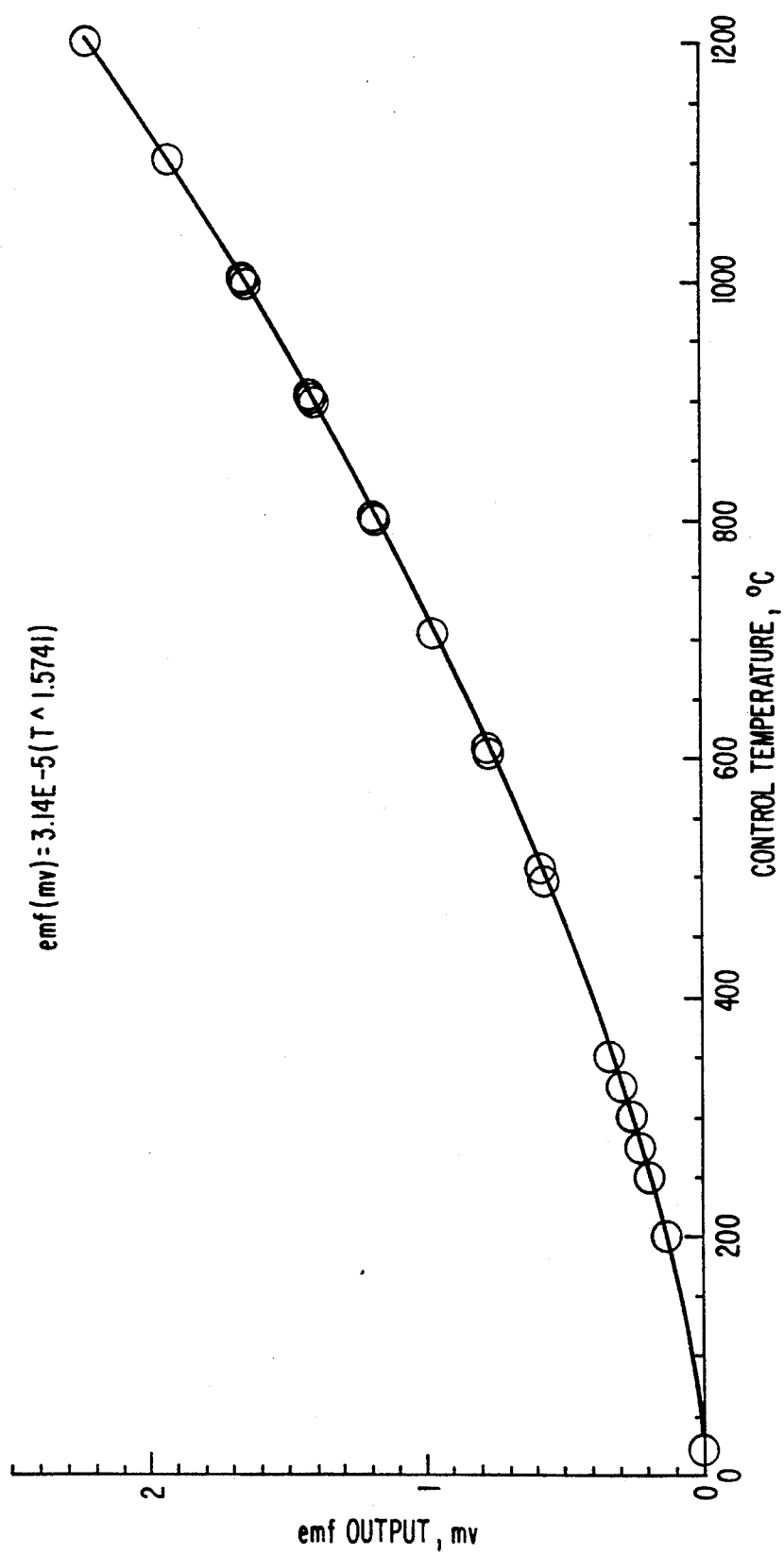

HIGH TEMPERATURE, OXIDATION RESISTANT NOBLE METAL-AL ALLOY THERMOCOUPLE

ORIGIN OF THE INVENTION

The invention described herein was made by employees of the U.S. Government and may be manufactured and used by or for the Government, for governmental purposes without the payment of any royalties thereon or therefor.

BACKGROUND OF THE INVENTION

1. Field of the Invention

This invention relates to a thermocouple adapted for accurate and reproducible measurement of high temperatures in inert, oxidizing or reducing environments, gases, or vacuum, and more particularly to a thermocouple leg comprising a noble metal-Al alloy.

2. Description of the Prior Art

High melting, noble metal thermocouples made of e.g., platinum (Pt), rhodium (Rh), palladium (Pd), iridium (Ir), etc., and alloys thereof are known in the art. For example, the most widely used thermocouple for measurement of temperatures above 1000° C. is Pt-Pt13Rh, where one leg of the thermocouple is made of a wire or thin film of Pt and a second leg of the thermocouple is made of a wire or thin film of Pt13Rh (i.e., an alloy of platinum and rhodium containing 13 wt. % rhodium). The emf-temperature response of a Pt-Pt13Rh thermocouple, the basis of temperature measurement via thermocouples, is high (e.g., about 12.5 mv at 1200° C.), and its oxidation resistance is good. The Pt-Pt13Rh thermocouple can be used with minimal drift (i.e., a change in emf with time due to any cause such as composition change, oxidation or chemical attack) up to 1500° C. Other precious metal elements, e.g., Pd and Ir, or alloys thereof with Pt are also useful thermocouples. Such thermocouples are not widely used because they are more susceptible to oxidation than Pt, and degrade by drift caused by selective oxidation.

On the other hand, Pt-modified pack aluminide coatings and the oxidation properties of these coatings in Pt-Al bulk alloys are known in the art. However, none of this technology concerns coating of Pt wires, making Pt-Al alloy wires, or using Pt-Al wires as thermocouple devices. The essence of the Pt-modified aluminide coating is that a thin layer (less than about 0.025 mm) of Pt is plated or CVD coated onto a nickel-base superalloy and then aluminized to form a Pt-Al rich outer layer in a NiAl coating. The Pt-Al phases are more diffusionally stable than NiAl, and serve as a long-term aluminum reservoir for protective $Al_2O_3$ scale formation. Pt-Al oxidation studies have shown that about 5-10 a/o Al (atom %) is needed to form a protective $Al_2O_3$ scale. Excellent oxidation resistance is obtained for these alloys.

A disadvantage of Pt-Pt13Rh as a thermocouple is its use of the strategic precious metal Rh. Rh is expensive and its availability is unreliable. Rh is also somewhat more prone to oxidation than Pt, so that alloys thereof suffer selective elimination of Rh resulting in a change in the emf of a Pt-Pt13Rh thermocouple over time (i.e., a temperature measurement inaccuracy). In reducing atmospheres, contact with any silica-containing material, e.g., silica-based refractories and SiC or $Si_3N_4$ ceramics, can result in low melting Pt-Si compounds and destruction of the thermocouple.

The following patents relate to high temperature thermocouples, including Pt-Rh elements or analogous alloys which utilize rare and expensive metals or other metals.

U.S. Pat. No. 3,901,734 to Sibley et al relates to a thermocouple in which the positive element consists of an iron-nickel alloy and the negative element consists of a copper-nickel alloy. The compositions of these elements are such that inexpensive lead wires of copper, for example, may be used without any significant temperature error, where the thermocouple is used to monitor a temperature of about 1600° F. and the lead wire-thermocouple junction is at a temperature not exceeding about 400°-500° F. Particularly, the emf output of the Sibley et al thermocouple between 32° F. and about 500° F. is said to approach substantially zero when the compositions of the positive and negative thermoelements are properly selected.

U.S. Pat. No. 4,402,447 to Przybyszewski et al relates to a method for bonding a platinum base metal lead wire to a thin platinum alloy film (typically Pt or Pt10Rh) resting on a thin alumina insulating layer adhered to a metal substrate. Typically, the platinum alloy film forms an element of a thermocouple for measuring the surface temperature of a gas turbine airfoil.

U.S. Pat. No. 4,984,904 to Nakano et al relates to a platinum-platinum/rhodium alloy thermocouple housed in an immersion protection tube used to monitor the temperature of molten metal. The immersion protection tube formed of alumina-graphite is said to protect the thermocouple from high temperature exposure to a reducing atmosphere.

U.S. Pat. No. 5,043,023 to Bentley relates to a metal sheathed thermocouple cable comprising an oxidation-resistant nickel-based alloy. The thermocouple cable is said to have excellent thermoelectric and mechanical stability at high temperatures (beyond about 900° C.), and is said to avoid premature failure due to oxidation that occurs in "bare-wire" thermocouples.

The following technical publications relate to platinum modified aluminide diffusion coatings.

M. R. Jackson et al, "The Aluminization of Platinum and Platinum-Coated IN-738", *Metallurgical Transactions A*, Vol. 8A, pages 1697-1707 (November 1977) relates to the chemistry and morphology of aluminide coatings formed on platinum and platinum-coated IN-738. These coatings are used to protect Ni-base superalloy gas turbine components from oxidation and hot corrosion attack.

J. S. Smith et al, "Platinum Modified Aluminides-Present Status", presented at the Gas Turbine and Aeroengine Congress and Expedition-Brussels, Belgium (Jun. 11-14, 1990) provides an overview of the development of platinum modified aluminide diffusion coatings used to impart oxidation and hot corrosion resistance to nickel-base superalloys. This paper discusses various coating morphologies and application of a low pressure chemical vapor deposition (low pressure CVD) process for production of platinum modified aluminide gas phase coatings on gas turbine components.

SUMMARY OF THE INVENTION

Accordingly, a first object of this invention is to provide a thermocouple for accurate and reproducible measurement of high temperatures (600°-1300° C.) in inert (e.g., Ar, He), oxidizing (e.g., air, $O_2$, $CO_2$, $H_2O$)

or reducing (e.g., $H_2$, CO, $CH_4$) environments, gases, or vacuum.

A second object of this invention is to provide a thermocouple which exhibits low emf drift (defined as the change in emf with time due to any cause such as composition change, oxidation or chemical attack) for measurement of high temperatures in the above described environments.

A third object of this invention is to provide a thermocouple element for high temperature measurement which circumvents the need for expensive, strategic precious metals such as rhodium (Rh) as a constituent component. In this manner, selective oxidation of Rh is also precluded.

Other objects of this invention will become apparent in the following description and Example.

The present inventors have discovered that the above first and second objectives are achieved by a thermocouple comprising an electropositive leg and an electronegative leg, the electropositive leg and the electronegative leg being electrically joined at respective ends thereof to form a thermocouple junction, wherein the electropositive leg comprises a noble metal-Al alloy.

The present inventors have also discovered that the above third objective is achieved in accordance with a preferred embodiment of this invention where the electropositive leg comprises noble metal-Al alloy, and the noble metal is selected from the group consisting of Pt, Ir, Pd, Ag and Au. More preferably, the electropositive leg comprises a Pt-Al alloy. The electropositive leg and preferably the electronegative leg do not contain Rh.

Pt-Al alloys are known to form a protective $Al_2O_3$ scale when exposed to an oxidative atmosphere. Ir is also known to form oxidation resistant alloys with aluminum, in much the same way as Pt-Al alloys are oxidation resistant. Similarly, we also expect Rh, Pd, Ag and Au to form oxidation resistant alloys with aluminum, but with decreasing temperature capability. Thus, Ir-Al or Pt-Ir-Al or Pd-Al alloy thermocouple legs, for example, are within the scope of this invention.

What was not hitherto recognized is that a significant emf exists between joined wires of a noble metal and a noble metal-Al alloy exposed to a high temperature differential, which allows these materials to advantageously be used as component parts of a novel type of thermocouple.

Also, we can envision a dilute Pt-Al alloy joined to a rich Pt-Al alloy that both form protective $Al_2O_3$ scales, and are more diffusionally stable than just a pure Pt leg coupled to a Pt-Al leg. That is, the chemical driving force for diffusion would be reduced.

Thus, a first advantage of the thermocouple of the present invention over prior art thermocouples is that the expensive, strategic precious metal rhodium is not needed as a constituent component. Other benefits are that protective $Al_2O_3$ scales form over the thermocouple leg, to thereby lessen any oxidation and vaporization of constituent components. This is especially useful when the thermocouple leg is in the form of a thin film, where vaporization and reaction with the underlying substrate is critical and may be alleviated by the protective $Al_2O_3$ scales formed, for example, on Pt-Al alloys.

It is to be understood that both the foregoing general description and the following detailed description are exemplary and explanatory but are not to be construed as being restrictive of the invention.

BRIEF DESCRIPTION OF THE DRAWINGS

FIG. 3 is a graphical presentation showing emf output (mV) as function of temperature of the Pt/Pt-Al thermocouple having an electropositive Pt leg wire aluminized for four (4) hours at 1000° C. of the Example below. The superimposed circles are duplicate measurements giving nearly the same reproducible values.

DETAILED DESCRIPTION OF THE INVENTION

Figure 1:
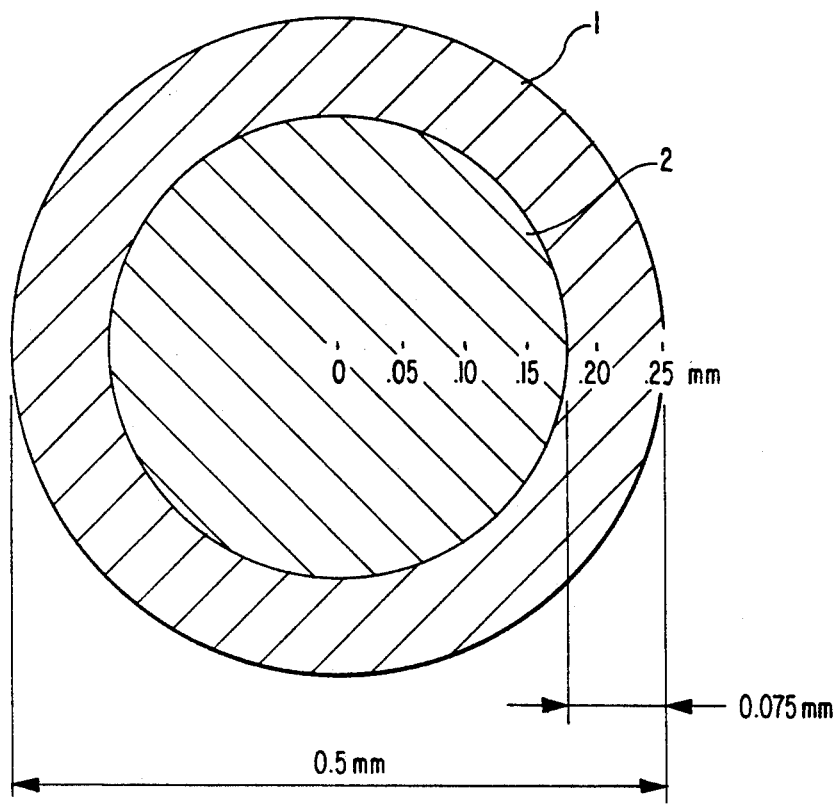
FIG. 1 is a cross-sectional representation of the Pt leg wire of the Example below aluminized for four (4) hours at 1000° C. in accordance with the present invention.

The form of the thermocouple leg of the present invention is not particularly limited, and may comprise, for example, a thin wire or a thin film. A thermocouple leg wire in accordance with the present invention generally ranges from 0.25 to 2.0 mm in diameter, and Pt-Al coated wires in accordance with a preferred embodiment prepared, for example, by pack aluminizing or CVD (chemical vapor deposition) have a diameter of from 0.5 to 2.0 mm for optimum behavior. Thin film thermocouple elements in accordance with the present invention generally have a thickness in the range of from 0.02 to 0.20 mm. U.S. Pat. No. 4,402,447 to Przybyszewski et al describes the preparation of thin Pt/Rh alloy films and the joining of lead wires thereto for preparation of a high temperature thermocouple, and is incorporated herein by reference.

The noble metal for use in the present invention is selected from Pt, Ir, Rh, Pd, Ag, Au and combinations thereof. Pt and Ir are preferred. Pt is most preferred. When the thermocouple leg of the present invention does not contain Rh, the noble metal is selected from Pt, Ir, Pd, Ag, Au and combinations thereof.

The noble metal-Al alloy may take the form of a simple mixture, solid solution or intermetallic compound (e.g., a $Pt_xAl_y$ compound), or combinations thereof. The minimum Al content of the noble metal-Al alloy is about 5 atom %, and more preferably about 10 atom % for totally protective oxide formation, whereas the maximum Al content of the noble metal-Al alloy is about 67 atom % due to increasing brittleness with an increase in Al content. The Al content is preferably from 10 to 50 atom %.

As discussed above, the electropositive leg comprises a noble metal-Al alloy. The electronegative leg can comprise, for example, a noble metal or a noble metal-Al alloy, as long as the Al contents of the first and second legs are sufficiently different to produce an acceptable emf. In a preferred embodiment, both legs comprise a noble metal-Al alloy to thereby benefit from the oxidation resistance provided by the protective $Al_2O_3$ scale. A preferred combination is 15–67 atom % Al and more preferably 40–60 atom % Al for the noble metal-Al alloy of the electropositive leg and 5–10 atom % Al for the noble metal-Al alloy of the electronegative leg. Particularly, this preferred combination allows a useful emf to be generated because of the substantial difference in Al contents, but still allows some formation of a protective $Al_2O_3$ scale on the electronegative leg, while minimizing the potential for interdiffusion and emf drift.

The thermocouple legs comprising noble metal-Al alloys can be prepared, for example, by pack aluminizing, CVD coating, sputtering under a vacuum, or by pre-alloying in the master melt form of the wire or thin film production process. For example, pack aluminizing is readily accomplished by placing a noble metal wire in a bed of inert $Al_2O_3$ sand containing about 2 wt. % Al powder and about 2 wt. % $NH_4Cl$ activator at a temperature of about 1,000° C. The amount of aluminum incorporated into a coating of the noble metal wire increases with the pack aluminizing time. Pack aluminizing times of 1 to 4 hours are typical.

On the other hand, low pressure chemical vapor deposition may be employed to prepare a noble metal modified aluminide gas phase Al coating on a suitable substrate such as a Pt wire (or one of the other noble metals as defined above) followed by a post coating diffusion treatment (annealing) to form a noble metal - Al alloy. In the CVD coating process, HCl or HF is typically passed over a source of aluminum to generate an aluminizing gas. Advantageously, annealing can be conducted as part of the CVD cycle.

Alternatively, sputter coating of noble metal - Al alloys under vacuum is well adapted for preparing thin film alloy thermocouple elements for use in this invention. The thin film alloy thermocouple element might be deposited, for example, on a substrate such as a turbine airfoil test component as described by Przybyszewski et al, supra. In this case, the substrate does not participate in forming the noble metal - Al alloy.

J. S. Smith et al, and M. R. Jackson et al, supra. describe pack aluminizing and CVD coating; Przybyszewski et al, supra. describe sputtering under vacuum; and S. M. Sze, *VLSI Technology*, McGraw-Hill Book Company, pages 347-361 (1983) describes various techniques for Al metallization including physical vapor deposition, resistance heated evaporation, E-beam evaporation, inductive heating, sputtering and CVD. A post coating diffusion (annealing) treatment following Al metallization is typically carried out at a temperature of from 1000° to 1200° C. for a time of from 1 to 20 hrs. in argon or vacuum (i.e., non-oxidizing). All of the above techniques are readily adapted by one of ordinary skill in the art for preparing the noble metal-Al alloy for use in this invention.

The term "coating" is used herein to describe a noble-metal Al alloy formed in the outer portion of a substrate by pack aluminizing, as well as a noble metal-Al alloy formed, e.g., by Al deposition onto a substrate followed by post coating diffusion treatment.

Inhomogeneity of a CVD coated or pack aluminized wire may cause diffusional instability. This could result in emf drift of the thermocouple, and is preferably minimized. We have found that annealing of the CVD coated or packed aluminized thermocouple leg element at about 1400° C. for about two hours in an inert atmosphere such as argon provides for homogenization of the outer aluminide coating, and effectively minimizes diffusional instability.

When Al is supplied as a coating, we found successful operation of a Pt-Al thermocouple leg (following diffusion heat treatment) in the $Pt_2Al_3$ to $PtAl_2$ range. Thick $PtAl_2$ coatings (0.18-0.25 mm) can cause cracking of a 1.0 mm diameter Pt wire if bent. We expect thin $PtAl_2$ coatings of about 0.02-0.10 mm to be most useful. The amount of Pt consumed is generally on the order of ½ of the coating thickness. We expect noble metal-Al alloy coatings having a thickness of from 0.02 to 0.20 mm to be useful in this invention.

The preferred phases of the Pt-Al alloy are $Pt_2Al_3$ or $PtAl_2$ when the thermocouple is formed as a coating. However, as a bulk wire, the alloy may have to be PtAl or even less Al, and thus less emf, in order to maintain sufficient bulk ductility. Coated Pt wires thus offer a dual advantage of a ductile, low Al, core material combined with a thin high Al, high emf, Pt aluminide coating. For purposes of the aluminized wire, we optimized the thickness of the $PtAl_2$ phase based on good emf response and suitable ductility. This was accomplished by aluminizing at 1,000° C. for 1, 4 and 16 hrs. as discussed in the Example below. We found that the 4 hr. treatment provided the best overall results.

In accordance with a preferred embodiment of this invention, the electropositive and electronegative legs comprising a Pt-Al alloy do not contain Rh. In this manner, selective oxidation and the expense of Rh is thereby precluded.

The electropositive leg and electronegative leg of the thermocouple of the present invention may be electrically joined at respective ends thereof to form a thermocouple junction, for example, by welding or by mechanical joining such as compression bonding. U.S. Pat. No. 4,415,758 to Lacoste et al describes a process for making a thermocouple junction between two small size thermocouple leg wires and is incorporated herein by reference. When used in the form of a thin film, the electropositive leg comprising a noble metal - Al alloy film and the electropositive leg comprising, for example, a Pt film may overlap to form a thermocouple junction as described by Przybyszewski et al., supra.

A thermocouple circuit in accordance with the present invention comprises an electropositive leg and an electronegative leg electrically joined together at one end (sensing junction) and terminated at their other end in such manner that the terminals (reference junction) are both at the same and known temperature (reference temperature). Connecting leads from the reference junction to a load resistance (e.g., an indicating meter such as a galvanometer or voltmeter, or the input impedance of other readout or signal-conditioning equipment) complete the thermocouple circuit. The connecting leads may be of copper alloy or some other metal different from the metals joined at the sensing junction. U.S. Pat. No. 3,372,062 to Zysk describes base metal leads for a noble metal thermocouple and is incorporated herein by reference. A current is caused to flow through the circuit whenever the sensing junction and the reference junction are at different temperatures. The reference junction may be held at a known constant temperature, or may be electrically compensated for variations from a preselected temperature.

The thermocouple of the present invention may also take the form of a thermopile comprising a plurality of sensing junctions of the same material pairs in close proximity to each other and connected in series so as to multiply the emf output obtainable from a single sensing junction. The isothermal reference junctions are usually also in close proximity to each other to assure an equal temperature for each reference junction.

For details regarding thermocouple circuits, reference may be made to *Electronics Engineers' Handbook*, 3rd Ed. McGraw-Hill Book Company, pages 10-30 to 10-32 (1989); Vassos et al, *Analog and Digital Electronics for Scientists*, pages 252-254, John Wiley & Sons, Inc. (1972); and A. J. Diefenderfer, *Principles of Electronic*

*Instrumentation*, pages 82-84, W. B. Saunders Company (1972).

Details with respect to the present invention will be further described by way of the following Example to illustrate aspects of this invention, which Example is not intended to limit the scope or applicability of this invention.

EXAMPLE

Three (3) Pt-Al wires were prepared by aluminizing three (3) Pt wires for 1, 4 or 16 hrs. Aluminizing was accomplished by standard pack aluminizing at 1,000° C. in a bed of inert $Al_2O_3$ sand containing 2 wt. % Al powder and 2 wt. % $NH_4Cl$ activator. The aluminum pickup was monitored by Pt sheet specimens in the same packs, gaining 1.3 and 4.7 mg/cm$^2$ for the 1 and 4 hr. treatments, respectively. The 16 hr. sheet sample spalled due to excessive aluminizing and brittleness. X-ray diffraction of the sheet samples revealed the presence of primarily $Pt_2Al_3$ coating phases on all three wires. PtAl and the brittle $PtAl_2$ phases were also present on the 1 and 16 hr. wires, respectively. One end of each wire was then torch welded to the ends of three Pt wires. All three resulting thermocouples were diffusion annealed at 1400° C. for 2 hrs. in argon to homogenize the outer aluminide coating. In reference to FIG. 1, the aluminide coating 1 over Pt core 2 of the 4 hr. wire had a thickness of about 0.075 mm. The Pt wires each had a diameter of 0.5 mm.

Figure 2:
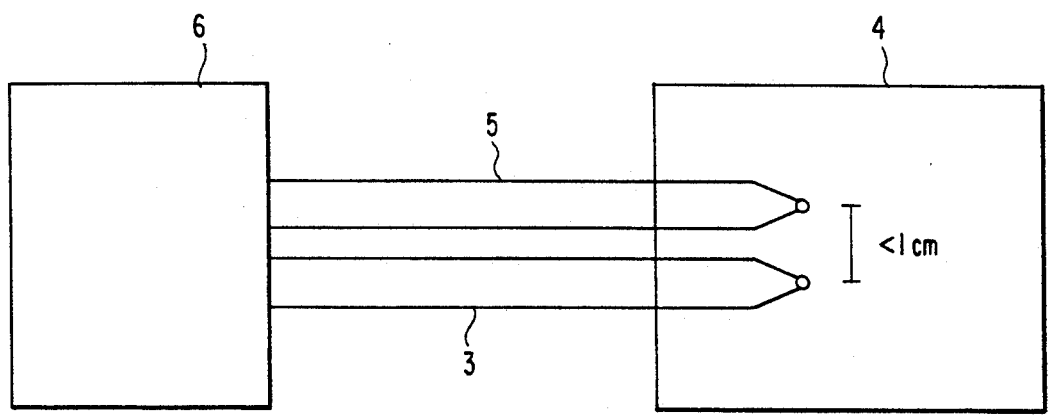
FIG. 2 is a diagram showing the method of Pt-Al thermocouple calibration of the Example below.

By reference to FIG. 2, the thermocouples 3 thus prepared were individually calibrated in a high temperature furnace 4 at temperatures up to 1400° C. against a standard Type R Pt-Pt13Rh couple 5 physically located less than 1 cm away. Measurements were taken by a voltmeter 6 (Doric 400A) in 100° C. degree increments. The lead wires 7 extending from the thermocouples were standard Type R thermocouple compensating copper alloy extension wires. Emfs of 0.62, 3.75 and 7.50 mV were obtained at 1400° C. for the 1, 4 and 16 hr. aluminized Pt-Al thermocouples, respectively. The 4 hr. thermocouple was aged at 1200° C. in air for 100 hrs. to check for drift, but no significant trend could be detected. A re-calibration run was conducted on the 4 hr. thermocouple, and the response thereof could be described by the equations:

$$emf = 3.14E\text{-}5(T^{1.5741})$$

or $$emf = -4.50E\text{-}11T^3 + 1.018E\text{-}6T^2 + 7.226E\text{-}4T - 4.448E\text{-}2$$

The excellent fit of the first equation to the data is shown in FIG. 3. A similar fit was obtained with the second equation.

It should further be apparent to those skilled in the art that various changes in form and detail of the invention as shown and described above may be made. It is intended that such changes be included within the spirit and scope of the claims appended hereto.

What is claimed is:

1. A thermocouple comprising an electropositive leg and an electronegative leg, said electropositive leg and said electronegative leg being electrically joined at respective ends thereof to form a thermocouple junction, wherein the electropositive leg comprises a noble metal-Al alloy.

2. The thermocouple of claim 1, wherein the noble metal is selected from the group consisting of Pt, Ir, Rh, Pd, Ag and Au.

3. The thermocouple of claim 1, wherein the noble metal is selected from the group consisting of Pt and Ir.

4. The thermocouple of claim 1, wherein the noble metal is Pt.

5. The thermocouple of claim 1, wherein the electronegative leg is made of Pt.

6. The thermocouple of claim 1, wherein the electronegative leg comprises a noble metal-Al alloy.

7. The thermocouple of claim 1, wherein the electropositive leg comprises a wire having a diameter of from 0.25 to 2.0 mm.

8. The thermocouple of claim 1, wherein the electropositive leg and the electronegative leg each comprise a film having a thickness of from 0.02 to 0.20 mm, which films overlap at respective ends thereof to form a thermocouple junction.

9. The thermocouple of claim 1, wherein the noble metal-Al alloy has an Al content of from 5 to 67 atom %.

10. The thermocouple of claim 1, wherein the electronegative leg comprises a noble metal-Al alloy having an Al content of from 5 to 10 atom % and the noble metal-Al alloy of the electropositive leg has an Al content of from 15 to 67 atom %.

11. The thermocouple of claim 1, wherein the electropositive leg is made of a noble metal-Al alloy.

12. The thermocouple of claim 1, wherein the electropositive leg comprises a substrate having a noble metal-Al alloy coating having a thickness of from 0.02 to 0.20 mm.

13. The thermocouple of claim 12, wherein the substrate is Pt, the noble metal of the noble metal-Al alloy coating is Pt, and the noble metal-Al alloy has an Al content of from 5 to 67 atom %.

14. A thermocouple comprising an electropositive leg and an electronegative leg, said electropositive leg and said electronegative leg being electrically joined at respective ends thereof to form a thermocouple junction, wherein the electropositive leg comprises a Pt wire having a Pt-Al alloy coating and the electronegative leg comprises a Pt wire or a Pt wire having a Pt-Al alloy coating.

15. The thermocouple of claim 14, wherein the Pt-Al alloy coating of the electropositive leg has an Al content of from 5 to 67 atom % and the electronegative leg comprises a Pt wire.

16. The thermocouple of claim 14, wherein the Pt-Al alloy coating of the electropositive leg has an Al content of from 15 to 67 atom %, and the electronegative leg comprises a Pt wire having a Pt-Al alloy coating having an Al content of from 5 to 10 atom %.

17. The thermocouple of claim 16, wherein the electropositive leg wire has a diameter of from 0.25 to 2.0 mm and the electronegative leg wire has a diameter of from 0.25 to 2.0 mm.

18. The thermocouple of claim 14, wherein the electropositive leg does not contain Rh.

19. The thermocouple of claim 14, wherein both the electropositve and electronegative legs do not contain Rh.

20. A thermocouple comprising an electropositive leg and an electronegative leg, said electropositive leg and said electronegative leg being electrically joined at respective ends thereof to form a thermocouple junction, wherein the electropositive leg comprises a noble metal - Al alloy, the noble metal is selected from the group consisting of Pt, Ir, Pd, Ag and Au, and the electropositive leg does not contain Rh.

* * * * *